United States Patent
Handy et al.

(10) Patent No.: US 11,573,256 B2
(45) Date of Patent: Feb. 7, 2023

(54) METHOD AND CIRCUIT FOR DETECTING AN ARC FAULT

(71) Applicant: GE Aviation Systems Limited, Gloucestershire (GB)

(72) Inventors: Peter James Handy, Cheltenham (GB); Benjamin Robert Daffurn, Gloucester (GB); Frank Graham Osborne, Cheltenham (GB); Michael James Smith, Chadlington (GB)

(73) Assignee: GE Aviation Systems Limited, Gloucestershire (GB)

( * ) Notice: Subject to any disclaimer, the term of this patent is extended or adjusted under 35 U.S.C. 154(b) by 290 days.

(21) Appl. No.: 16/715,925

(22) Filed: Dec. 16, 2019

(65) Prior Publication Data
US 2020/0191852 A1    Jun. 18, 2020

(30) Foreign Application Priority Data
Dec. 17, 2018    (GB) .................................... 1820540

(51) Int. Cl.
*G01R 31/08*    (2020.01)
*H01F 27/28*    (2006.01)
(Continued)

(52) U.S. Cl.
CPC ........... *G01R 31/08* (2013.01); *H01F 27/289* (2013.01); *H01F 27/2885* (2013.01);
(Continued)

(58) Field of Classification Search
CPC ........ G01R 31/08; G01R 31/62; G01R 31/14; G01R 31/52; G01R 31/1272; G01R 31/12;
(Continued)

(56) References Cited

U.S. PATENT DOCUMENTS

| 2,519,224 A | 8/1950 | Chiles, Jr. et al. |
| 3,963,975 A | 6/1976 | Gauper et al. |

(Continued)

FOREIGN PATENT DOCUMENTS

| CN | 101477167 A | 7/2009 |
| CN | 105071354 A | 11/2015 |

(Continued)

OTHER PUBLICATIONS https://www.electronics-tutorials.ws/transformer/transformer-construction.html (Year: 2012).*
(Continued)

*Primary Examiner* — Akm Zakaria
(74) *Attorney, Agent, or Firm* — McGarry Bair PC (57) ABSTRACT

A method and circuit for detecting a fault in a power transformer having an conductive shield layer sandwiched between electrical insulating layers separating the conductive shield layer from a first conductor and a second conductor, the second conductor opposite the conductive shield layer from the first conductor, and including, sensing a voltage energizing the shield layer, comparing the sensed voltage to a threshold voltage value corresponding to a fault, and upon satisfaction of the comparison, providing a fault indication when the comparison indicates the presence of a fault.

20 Claims, 4 Drawing Sheets

(51) Int. Cl.
*H02H 1/00* (2006.01)
*H01F 27/36* (2006.01)
*H01F 27/42* (2006.01)

(52) U.S. Cl.
CPC .......... *H01F 27/36* (2013.01); *H01F 27/363* (2020.08); *H02H 1/0015* (2013.01); *H01F 27/42* (2013.01)

(58) Field of Classification Search
CPC .... H01F 27/2885; H01F 27/289; H01F 27/36; H01F 27/363; H01F 27/42; H01F 27/402; H02H 1/0015; H02H 7/04; H02H 1/003
See application file for complete search history.

(56) References Cited

U.S. PATENT DOCUMENTS

| | | | |
|---|---|---|---|
| 5,012,125 A * | 4/1991 | Conway | H01F 27/34 336/229 |
| 5,883,508 A * | 3/1999 | Ermisch | G01R 15/06 324/126 |
| 8,023,294 B2 | 9/2011 | Ryan et al. | |
| 9,576,720 B2 | 2/2017 | de Groot | |
| 9,607,756 B2 | 3/2017 | Richardson | |
| 10,050,533 B2 | 8/2018 | Jacobson | |
| 10,830,808 B2 | 11/2020 | Handy et al. | |
| 2002/0140536 A1* | 10/2002 | Hopkinson | G01R 15/183 336/181 |
| 2009/0099444 A1* | 4/2009 | Bogdanov | G01R 33/34046 324/322 |
| 2012/0139556 A1 | 6/2012 | Annowsky et al. | |
| 2018/0032372 A1 | 2/2018 | Jacobson | |
| 2018/0375387 A1* | 12/2018 | Oshima | G01R 31/40 |

FOREIGN PATENT DOCUMENTS

| | | |
|---|---|---|
| CN | 105606979 A | 5/2016 |
| CN | 106019067 A | 10/2016 |
| CN | 108603907 A | 9/2018 |
| CN | 108700634 A | 10/2018 |

OTHER PUBLICATIONS

Peter Thomas-Keef, Patents Act 1977: Search Report Under Section 17, 4 pages, May 29, 2019, South Wales.

European Patent Office, Extended Search Report re Corresponding Application No. 19215047.2-1010, May 15, 2020, 8 pages, Munich, Germany.

* cited by examiner

METHOD AND CIRCUIT FOR DETECTING AN ARC FAULT

CROSS REFERENCE TO RELATED APPLICATION(S)

This application claims priority to and benefit of GB Patent Application No. 1820540.1 filed Dec. 17, 2018, now granted as GB2579838, issued on Aug. 31, 2021, which is incorporated herein in its entirety.

BACKGROUND

Electromagnetic devices, such as transformers are used to generate voltages utilizing alternating currents. The construction of these types of electromagnetic devices typically includes a central core constructed from of a highly permeable material to provide a required magnetic path. The ability of iron or steel to carry magnetic flux is much greater than it is in air, this is known as the permeability of the core and influences the materials used for the core portion of a transformer.

BRIEF DESCRIPTION

In one aspect, the present disclosure relates to an electrical fault detecting circuit including a first conductor wound about a permeable magnetic core, a second conductor wound about the permeable magnetic core, a conductive shield layer positioned between the first conductor and the second conductor, a set of electrical insulation layers separating the conductive shield layer from the first conductor and the conductive shield layer from the second conductor, an energization source electrically coupled with the conductive shield layer and energizing the conductive shield layer, and a controller module electrically coupled with the conductive shield layer. The controller module is configured to detect a change in the electrical characteristics of the energized conductive shield layer.

In another aspect, the present disclosure relates to a power transformer, including a former, a set of primary windings circumferentially wound about the former and connected with a transformer power input, a first insulation layer encircling the set of primary windings, a conductive shield layer circumferentially wound about the first insulation layer and energized at a predetermined voltage by an energization source, a second insulation layer encircling the conductive shield, a set of secondary windings encircling the second insulation layer and connected with a transformer power output, and a controller module connected with the conductive shield layer and configured to sense an actual voltage at the conductive shield layer and compare the sensed actual voltage with a voltage threshold, and when the sensed actual voltage exceeds the voltage threshold, determine an electrical fault is present in the power transformer.

In yet another aspect, the present disclosure relates to a method of detecting a fault in a power transformer having a conductive shield layer sandwiched between electrical insulating layers separating the conductive shield layer from a first conductor and a second conductor, the second conductor opposite the conductive shield layer from the first conductor, the method including sensing a voltage energizing the shield layer, comparing the sensed voltage to a threshold voltage value corresponding to a fault, and upon satisfaction of the comparison, providing a fault indication when the comparison indicates the presence of a fault.

DETAILED DESCRIPTION

The described aspects of the present disclosure are directed to a method and apparatus associated with an electromagnetic device, including but not limited to transformers or power transformers. One example environment where such a method and apparatus can be used includes, but is not limited to, a power distribution system for a vehicle, such as an aircraft. While a power distribution system for an aircraft is mentioned, it is also applicable to any commercial or residential environment using a power distribution system, electromagnetic device, transformer, or power transformer where input power is received in a primary set of windings, and based on the adaption or configuration of a secondary set of windings in a magnetic relationship with the primary windings, outputs a power different from the input power, to a downstream component, such as one or more electrical loads. Furthermore, aspects of the disclosure can be applicable in any circuit or power environment utilizing isolated switched mode power supplies, or the like.

While "a set of" various elements will be described, it will be understood that "a set" can include any number of the respective elements, including only one element. As used herein, the terms "axial" or "axially" refer to a dimension along a longitudinal axis of a component or along a longitudinal axis of the component. Also as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value.

In another non-limiting example, a control module can include comparing a first value with a second value, and operating or controlling operations of additional components based on the satisfying of that comparison. For example, when a sensed, measured, or provided value is compared with another value, including a stored or predetermined value, the satisfaction of that comparison can result in actions, functions, or operations controllable by the controller module. As used, the term "satisfies" or "satisfaction" of the comparison is used herein to mean that the first value satisfies the second value, such as being equal to or less than the second value, or being within the value range of the second value. It will be understood that such a determination may easily be altered to be satisfied by a positive/negative comparison or a true/false comparison.

Example comparisons can include comparing a sensed or measured value to a threshold value or threshold value range.

While terms such as "power" can be used herein, it will be evident to one skilled in the art that these terms can be relative to, or related to respective voltages, currents, or a combination thereof, when describing aspects of the electrical circuit, or circuit operations. All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured, connected, or connectable to provide, enable, disable, or the like, an electrical connection between respective elements. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

Additionally, as used herein, an electrical arc or arcing event is an unintended or undesired conduction of current across a traditionally non-conductive medium, such as air or an insulation layer. For example, in non-limiting instances, a parallel arc can include an arcing event at least partially connecting two points which are intended to be insulated from each other. In another non-limiting instance, a series arc can include an arcing event in which a conductive medium becomes non-conductive or poorly conductive between two parts of an intended conductive path. Furthermore, in non-limiting instances, an arcing event or an "arc fault" can include the unexpected power loss situation, regardless of whether there is an obvious arc manifestation (e.g. a visible or visually identifiable occurrence). In another non-limiting instance, a series arc can include an unexpected impedance. Electrical arcs might occur in an environment where, for example, physical defects in an electrical connection, or insulation thereof, cause a permanent or temporary loss in transmission capabilities.

The exemplary drawings are for purposes of illustration only and the dimensions, positions, order and relative sizes reflected in the drawings attached hereto can vary.

Figure 1:
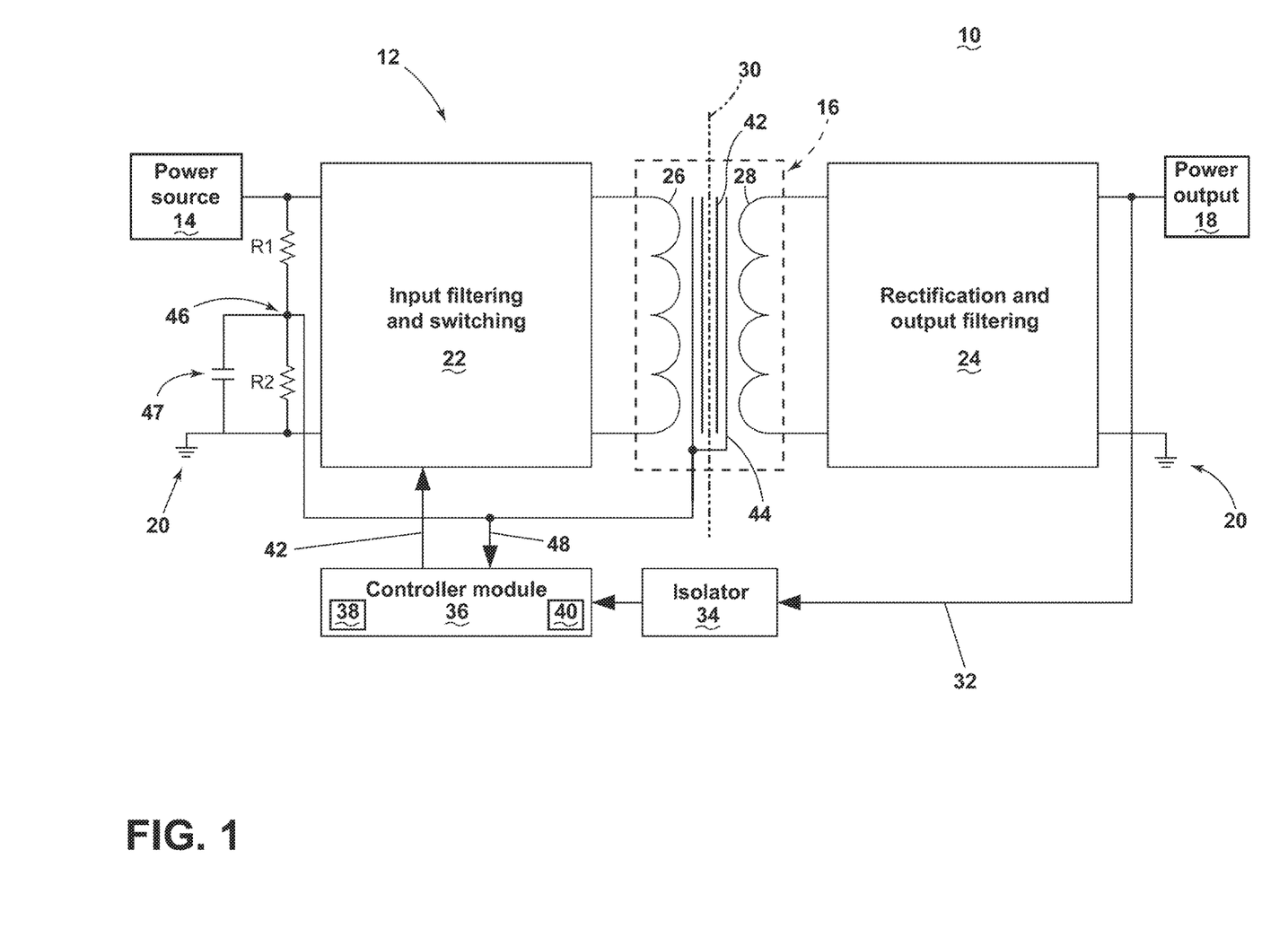
FIG. 1 is schematic view of a power transformer and circuit for detecting an arc fault in the power transformer, in an aircraft in accordance with various aspects described herein.

FIG. 1 illustrates a schematic view of a circuit 10 having electromagnetic device 12 configured, capable, or otherwise enabled to convert a first electrical power characteristic to a second electrical power characteristic, wherein the second electrical power characteristic is different from the first electrical power characteristic. As shown, the electromagnetic device 12 can include a transformer 16, such as a power transformer.

As shown, a power source 14 adapted to generate or supply a first power having the first electrical power characteristic is connected with a set of primary windings 26 of the transformer 16. In one non-limiting example of an isolated switched mode power supply, the power source 14 can be connected with the set of primary windings 26 by way of an input filtering and switching circuit 22, whereby power or signal filters can filter the power supply from the power source 14, and can selectively or controllably enable or disable the supplying of power from the power source 14 by way of switching capabilities. Aspects of the input filtering and switching circuit 22 are not germane to the aspects of the disclosure. In one example, the set of primary windings 26 can include a non-conductive layer or insulation layer about the windings to prevent conductive contact between the windings of the set of primary windings 26, or conductive contact between the set of primary windings 26 and other conductive components of the circuit 10 or electromagnetic device 12.

The primary windings 26 are in a magnetic relationship with a magnetically permeable core 42 of the transformer 16, which is further in a magnetic relationship with a set of secondary windings 28. The set of primary windings 26 are further electrically isolated (e.g. in a non-conductive relationship) from the set of secondary windings 28, which is schematically shown by a dotted isolation barrier 30. The isolation barrier 30 can include, but is not limited to, non-conductive or electrically insulating layers, wraps, coatings, or the like, or any electromagnetic interference layer.

The set of secondary windings 28 are further connected with a power output 18 having the second electrical power characteristics. In another non-limiting example, the set of secondary windings 28 can be connected with the power output 18 by way of a rectification and output filtering circuit 24, whereby the power received by the set of secondary windings 28 is rectified and filtered prior to being delivered to the power output 18. Aspects of the rectification and output filtering circuit 24 are also not germane to the aspects of the disclosure. In another example, the set of secondary windings 28 can include a non-conductive layer, dielectric layer, or insulation layer about the windings to prevent conductive contact between the windings of the set of secondary windings 28, or conductive contact between the set of secondary windings 28 and other conductive components of the circuit 10 or electromagnetic device 12.

The circuit 10 or electromagnetic device 12 can further include a feedback mechanism for operating the circuit 10 or electromagnetic device 12. For example, the circuit 10 can include a feedback signal that receives or carries a feedback value from the power output 18, by way of a signal or communication line 32. The communication line 32 can carry or transmit the feedback value from the power line to a controller module 36 having a processor 38 and memory 40. The controller module 36, in turn, can selectively operate aspects of the circuit 10 or electromagnetic device 12, such as the switching in the input filtering and switching circuit 22, by way of control signal 42. Thus, the controller module 36 can effect, enable, or operably control the supply of power to the set of primary windings 26 such that the expected or desired supply of power is delivered to the set of secondary windings 28 or power output 18. In one non-limiting example, the communication line 32 can further provide the feedback value to an isolator 34 prior to delivering the feedback value to the controller module 36. In this non-limiting example, the isolator 34 can be adapted or configured to, for instance, isolate the feedback for the set of primary winding 26 switching control signal 42.

Aspects of the circuit 10 or electromagnetic device 12 can further be included wherein a fault detection circuit is included. As shown, the fault detection circuit can include an electrical conductor, such as a shielding layer 44 or sheath layer, extending between at least the set of primary windings 26 and the set of secondary windings 28. While not shown in the schematic illustrations, the shielding layer or layers 44 can, for example, envelop, encircle, encompass, or be physically positioned between at least the set of primary windings 26 and the set of secondary windings 28. In another non-limiting example, the shielding layer 44 can envelop, encircle, encompass, or be physically positioned between each of the windings 26, 28, as well as between the windings and other conductive components of the circuit 10, the electromagnetic device 12, the core 42, or the like. Non-limiting examples of the shielding layer 44 can comprise a conductive foil, an electrostatic screen, or the like. In another non-limiting example, the shielding layer 44 can comprise of two or more separate portions in order to avoid having a shorted turn in the transformer 16.

The shielding layer 44 can further be connected with a voltage divider 46 configured or adapted to energize the shielding layer 44 at a known or predetermined voltage. For instance, as shown, the voltage divider 46 can be arranged between the conductive output of the power source 14 and a ground 20 connection, and include resistors (shown as R1 and R2) such that the output between the resistors is the predetermined voltage. In non-limiting examples, the predetermined voltage output of the voltage divider 46 can be adapted, configured, or the like, the resistors R1, R2 can be selected such that the predetermined voltage output is not equal to either the voltage output of the power source 14, the voltage output of the power output 18 or set of secondary windings 28, or a grounded voltage (i.e. zero volts) value. In this sense, the shielding layer 44 can be energized or energizable with the predetermined voltage output from the voltage divider 46.

The energized or energizable shielding layer 44 can be further connected with the controller module 36, which can be adapted to sense or measure the voltage of the shielding layer 44, by way of a voltage signal 48. In this sense, the controller module 36 can include a voltage sensor (not shown) adapted or configured to detect, sense, or measure a voltage at the shielding layer 44.

While a grounding connection 20 is shown, non-limiting examples of the circuit 10 can be included wherein the power source 14 or power output 18 is not relative to Earth ground 20, but rather to another voltage. In this example, the other predetermined voltage output of the voltage divider 46 can also be configured, adapted, or the like is not equal to the other voltage replacing the ground connection 20. Additionally, while the voltage divider 46 is shown relative to the power source 14, the voltage divider 46 can be energized, or otherwise adapted, to receive power and supply the predetermined voltage output from an alternative power source or supply that is not the power source 14. In non-limiting examples, a capacitor 47 can be include across the second resistor R2, and can operate to filter electromagnetic noise from being transmitted from the set of primary windings 26 to the set of secondary windings 28. In one example, the capacitor 47 can filter the noise from an electromagnetic screen (not shown), or wherein the shielding layer 44 can act as an electromagnetic screen.

Figure 2:
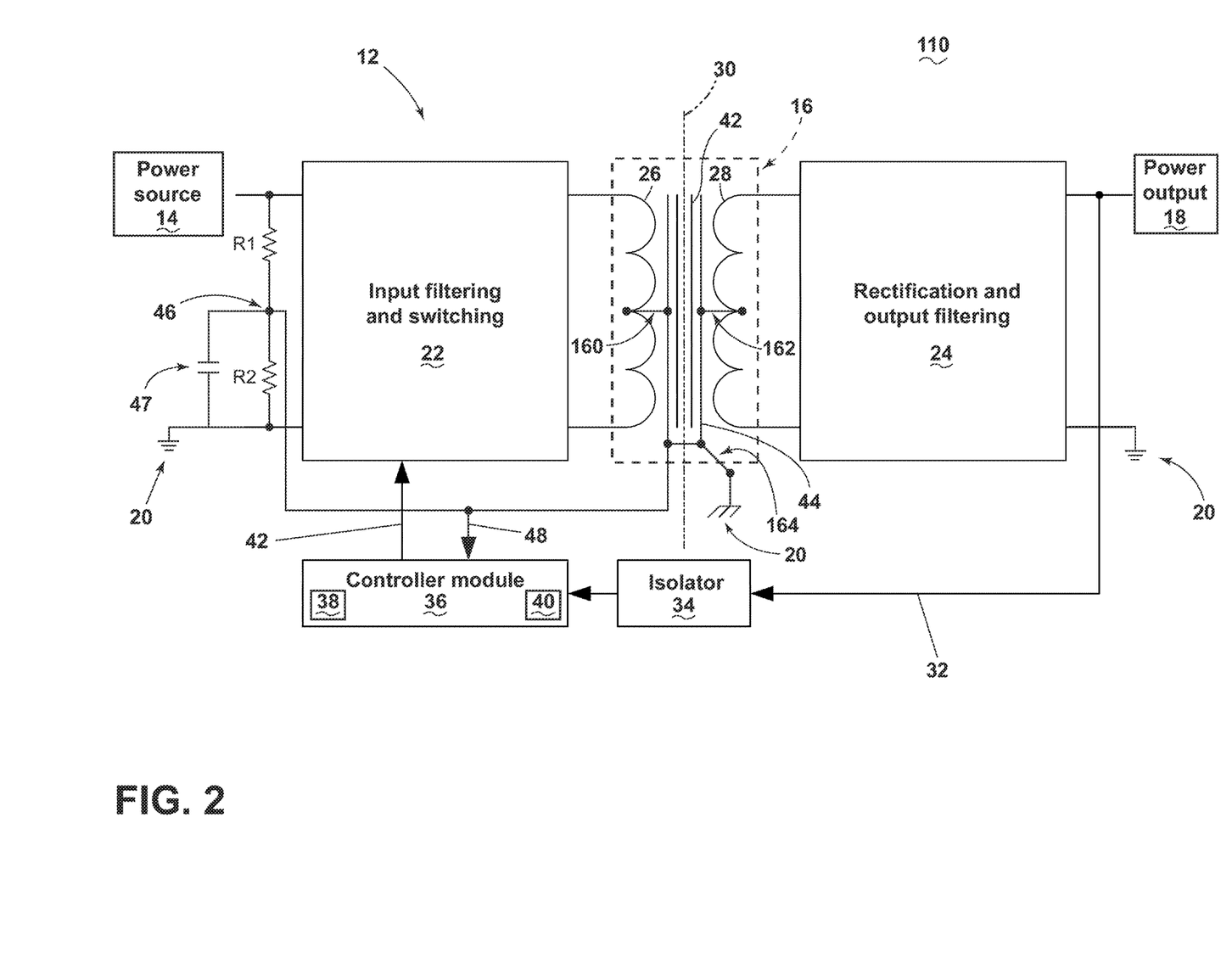
FIG. 2 is a schematic view of the power transformer and circuit of FIG. 1, demonstrating a set of arc faults detected by the circuit, in accordance with various aspects described herein.

During operation of the circuit 10, the fault detection circuit can be adapted or configured to provide fault protection, arc fault protection, fault detection, arc fault detection, or determination of a suspected, confirmed, or likely electrical fault event. As shown in FIG. 2, an example first fault 160 is shown in the set of primary windings 26. In this example, the first fault is an unintended or unintentional conductive event where current is conducted out of the set of primary windings 26, which is shown reaching the shielding layer 44. In one non-limiting example, this first fault 160 could be caused by a breakdown of an insulating layer of the set of primary windings 26, core 42, or the like. In this example, the shielding layer 44 will have a voltage level closer to the voltage at the set of primary windings 26, but the shielding layer 44 will not have a voltage level of the predetermined voltage. As previously described, the voltage level of the shielding layer 44 can be delivered to the controller module 36 by way of the voltage signal 48.

The controller module 36 can further be configured to compare the detected or sensed voltage from the voltage signal 48 with the predetermined voltage. Upon determining the detected or sensed voltage of the voltage signal 48 is not equal to the predetermined voltage (e.g. due to the presence of the first fault 160) or sufficiently beyond a comparison threshold with the predetermined voltage (e.g. greater than 5 volt difference from the predetermined voltage), determine an electrical fault has or is likely occurred, and controllably disable the circuit 10, the electromagnetic device 12, or the like. For example, upon determining an electrical fault is or has occurred, the controller module 36 can effect, disable, or operably cease the supply of power to the set of primary windings 26 from the power source 14, for instance, by way of the control signal 42 controlling the input filtering and switching circuit 22. In another non-limiting example, the controller module 36 can further or alternatively notify another system of the actual or suspected electrical fault, log and error, provide an alert, or the like.

Similarly, an example second fault 162 is illustrated, demonstrating a schematic electrical fault between the set of secondary windings 28 and the shielding layer 44, which will cause the shielding layer 44 to have a voltage level closer to the voltage at the set of secondary windings 28, compared with the predetermined voltage. Additionally, an example third fault 164 is shown demonstrating a schematic electrical fault between the shielding layer 44 and an electrical ground 20 (or another referential voltage level). In any set or subset of these electrical faults 160, 162, 164, the voltage signal 48 will provide the controller module 36 a sensed or detected voltage value different from the predetermined voltage, indicative of the electrical fault 160, 162, 164. Non-limiting examples of the disclosure can be included wherein, for example, the controller module 36 can further determine which components are included in the electrical fault, for example, by way of distinguishing the sensed or measured voltage level of the voltage signal 48. For example, a voltage signal 48 at or near the power source 14 voltage can indicate the first fault, a voltage signal 48 at or near the set of secondary windings 28 voltage can indicate the second fault 162, and a voltage signal 48 at or near electrical ground 20 voltage can indicate the third fault 164. The specific position of the faults 160, 162, 164 illustrated are merely non-limiting schematic examples of arcing events at the circuit 10, electromagnetic device 12, or the transformer 16.

Figure 3:
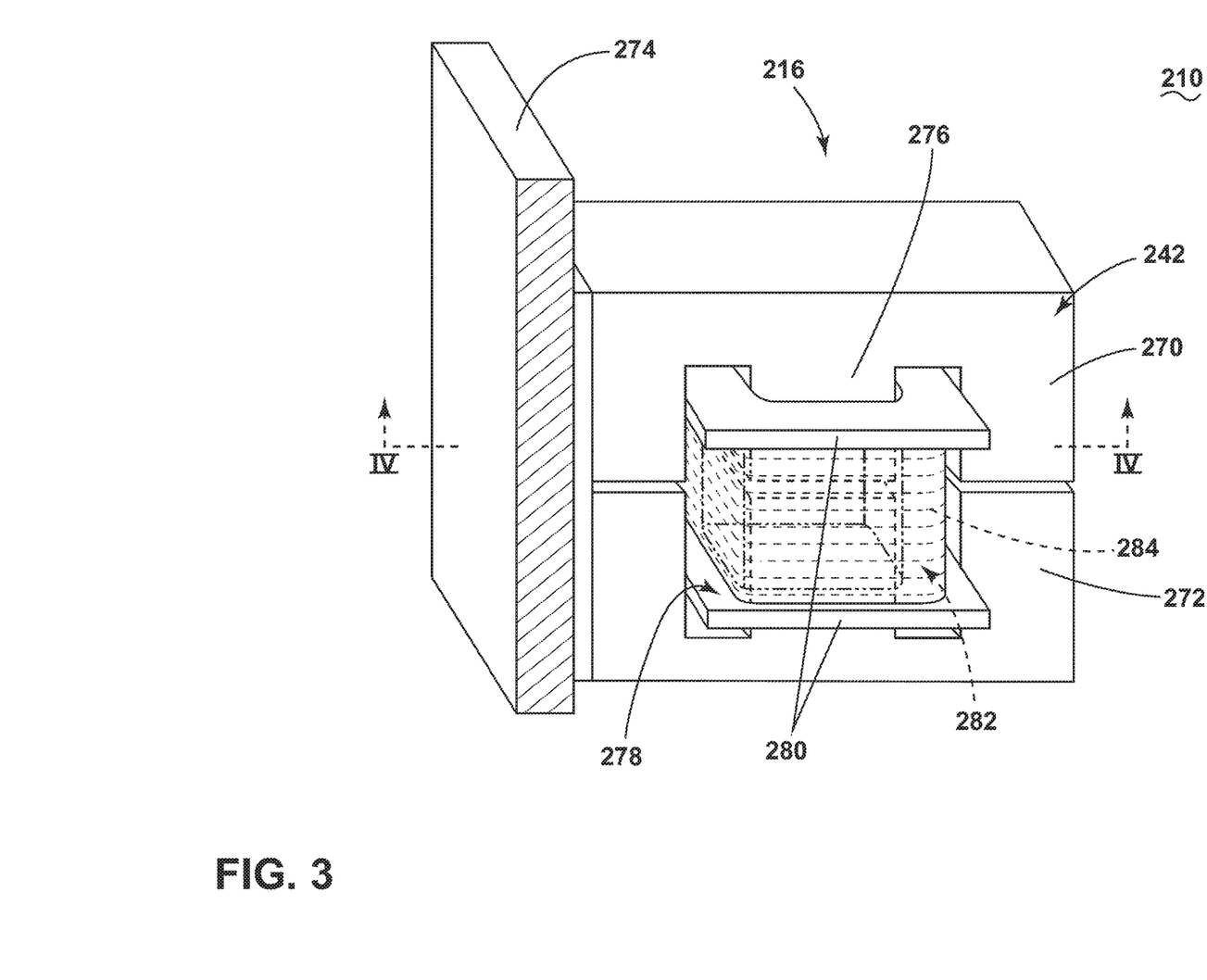
FIG. 3 is a perspective view of an example power transformer, in accordance with various aspects described herein.

FIG. 3 illustrates one non-limiting perspective view of aspects of the disclosure. As shown, a circuit 210 or transformer 216 can be included. The circuit 210 or transformer 216 is similar to the circuit 10 or transformer 16; therefore, like parts will be identified with like numerals increased by 200, with it being understood that the description of the like parts of the circuit 10 or transformer 16 applies to the circuit 210 or transformer 216, unless otherwise noted. One difference is that the transformer 216 includes a magnetically permeable core 242, shown as a core 242 including a first core segment 270 spaced from a second core segment 272.

At least two sets of windings 282, such as conductive coils 284, can be wound, wrapped, or otherwise formed about a former 278. The former 278 can further be carried across a center leg 276 of each of the first and second core segments 270, 272. Additionally, the former 278 can include axially spaced caps 280 positioned opposite each other in a direction between the first core segment 270 and the second core segment 272. The former 278 and caps 280 can comprise a non-conductive material, such as plastic, thermally conductive plastic, or a composite.

As described the at least two sets of windings 282 or conductive coils 284 can be circumferentially wound relative to the former 278, as well as relative to windings 282, themselves. For example, a first set of windings, such as the primary windings can be wound about the former 278 first, and thus be positioned closer to the radial center of the former 278, which can then be overlapped by a second set of windings. As previously described, each winding of the at least two sets of windings 282 or each coil, wire, or the like of the conductive coils 284 can be layer, wrapped, or otherwise insulated from adjacent windings or coils by way of an non-conductive insulating layer The first core segment 270 and second core segment 272, the former 278, and the at least two sets of windings 282 can be mounted to a common structure, shown schematically as a mounting bracket 274.

Figure 4:
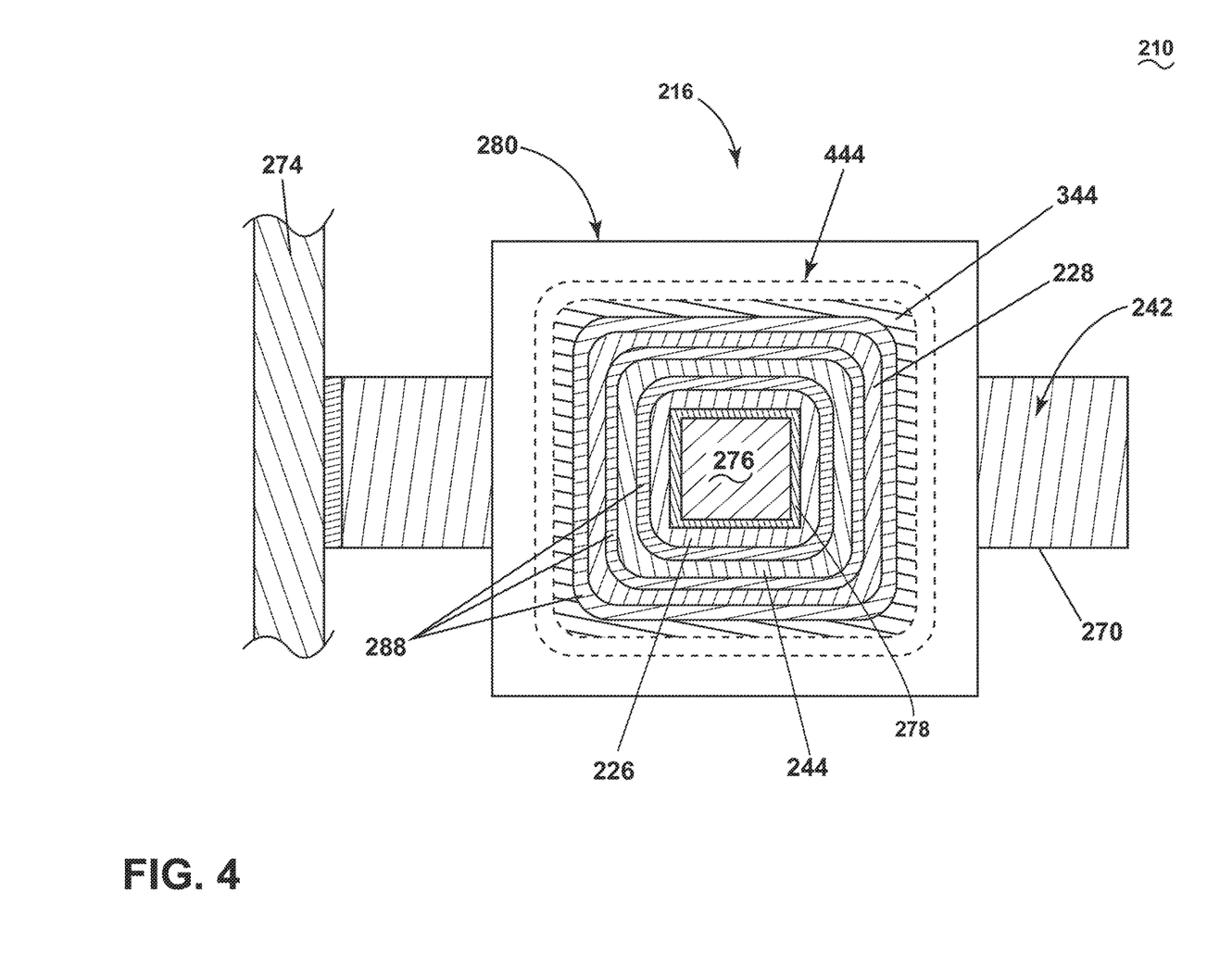
FIG. 4 is a cross-section of the power transformer taken along line IV-IV of FIG. 2, in accordance with various aspects described herein.

The circuit 210 or transformer 216 can further be seen in FIG. 4, which is a cross-sectional view of the circuit 210 taken along line IV-IV of FIG. 3. The view of FIG. 4 is represented schematically for ease of understanding. As better shown in FIG. 4, the structure of the former 278 and wrapping of the at least two sets of windings 226, 228 can include the center leg 276 in the radial center of the former 278. The first radial layer can include the set of primary windings 226, which can be similar to the set of primary windings 26 of FIGS. 1 and 2. Overlying or enveloping the set of primary windings 26 is a non-conductive insulation layer 288, which for example can be wrapped about the set of primary windings 26 to further ensure no conductive contact of the conductive windings is exposed.

The non-conductive insulation layer 288 covering the set of primary windings 26 can then be overlaid or enveloped with a shielding layer 244, such as the shielding layer 44 schematically represented in FIGS. 1 and 2. The shielding layer 244 can further be overlaid or enveloped with another non-conductive insulation layer 288. Overlaying or enveloping the insulation layer 288 outside of the shielding layer 244 can be another set of conductive windings, such as a set of secondary windings 228 which can be similar to the set of secondary windings 28 of FIGS. 1 and 2. The set of secondary windings 228 can further be optionally overlaid or enveloped with, respectively, a non-conductive insulation layer 288 followed by another shielding layer 344.

While multiple insulation layers 288 are shown, aspects of the disclosure can include additional or fewer insulation layers 288 between or isolating conductive layers 226, 228, 244 from one another. Furthermore, while the set of insulation layers 288 are all schematically illustrated with a similar cross section, independent insulation layer 288 can comprise different or dissimilar dielectric or non-conductive materials. For example, a first insulation layer 288 can include a non-conductive potting compound while a second insulating layer 288 can include a non-conductive wrap of composite, paper, plastic, or the like. In another non-limiting example, each of the caps 280 can further include an axial-facing shielding layer 444 between the respective sets of windings 226, 228 and the caps 280.

While a specific and separate insulating layer 288 is shown, non-limiting example of the disclosure can include any sort of insulating layer or electrical insulation between respective layers. For example, the insulating layer 288 can include an incomplete or non-uniform layer, such as insulating tape, an insulative coating disposed on one of the separated conductive layers (e.g. the set of primary windings 226, the set of secondary windings 228, or the shielding layer 244), or a combination thereof. In another example, the insulation layer(s) 288 can include another non-electrically conductive thermally conductive potting or insulation material.

During operation, the set of primary windings 226 can be connected with a voltage source, such as the power source 14 of FIGS. 1 and 2. The voltage is ultimately delivered to the set of primary windings 226, whereby an induced voltage is generated in the set of secondary windings 228, which is further provided to, for example, the power output 18 of FIGS. 1 and 2.

In the event that an electrical isolation layer or non-conductive layer of the sets of windings 226, 228 breaks down, is worn down, is damaged, or the like, or in the event that one of the insulating layers 288 breaks down, is worn down, is damaged, or the like, a conductive contacting event, arcing event, or electrical fault event (such as the first, second, or third faults 160, 162, 164 of FIG. 2) can result in a voltage being applied to at least one of the shielding layers 244. The difference in voltage at the respective shielding layer 244 is detected by the controller module 36, which responds by operating the circuit 10, 210 or transformer 16, 216, as needed.

Thus the arrangement of the shielding layer 244 disposed between conductive sets of windings 226, 228 can detect electrical faults. Furthermore, the arrangement of the shielding layer 244 disposed outside or external to the sets of windings 226, 228 (e.g. the most radially distal shielding layer 244) can further detect electrical faults that would otherwise be directed external to the transformer 216. In yet another non-limiting example, the axial-facing shielding layer 444 between the respective sets of windings 226, 228 and the caps 280 can detect and axially-directed electrical faults. In yet another non-limiting example, a shielding layer 244 can be included between the first conductive set of windings 226 and the former 278 or the center leg 276.

In yet another non-limiting example, while the schematic circuit 10 of FIGS. 1 and 2 shows a voltage divider 46 having a single voltage output energizing the shielding layer 44, aspects of the disclosure can be included wherein each respective shielding layer 44, 244, 444 (including different radially arranged shielding layers 44 of FIG. 4) can be energized at a different voltage, and have an independent connection with the controller module 36 to provide an individual voltage signal 48. In this sense, the controller module 36 can be configured or adapted to determine which shielding layer 44, 244, 444 is detecting an electrical fault based on the set of voltage signals 48. Furthermore, the controller module 36 can be configured or adapted to determine which electrical source of the electrical fault (e.g. the set of primary windings 26, 226, the set of secondary windings 28, 228, an electrical ground 20, or the like) is causing the fault, based on the sensed or measured voltage signal 48. Thus, the controller module 36 can be configured or adapted to identify which shielding layer 44, 244, 444 is detecting the electrical fault, and from what voltage source is the fault coming from. Such determinations can be useful in repair and diagnosis actions by maintenance personnel performing maintenance actions in response to the determination of an electrical fault by the controller module 36.

Aspects of the disclosure can also include a method for of detecting a fault in a power transformer, as described herein. For example, the method can include a power transformer having an conductive shield layer 44, 244 sandwiched between electrical insulating layers 288 separating the conductive shield layer 44, 244 from a first conductor (such as the set of primary windings 26, 226) and a second conductor (such as the set of secondary windings 28, 228), the second conductor opposite the conductive shield layer 44, 244 from the first conductor. The method can sense a voltage energizing the shield layer 44, 244, as described, and further compare the sensed voltage to a threshold voltage value corresponding to a fault, for example, in the controller module 36. Upon satisfaction of the comparison, the method can provide a fault indication when the comparison indicates the presence of a fault. A fault indication can include logging an error in system, generating an alert message or an alert sound, scheduling a maintenance event or maintenance action, or the like. As used herein, a maintenance event or maintenance action can include scheduling an action to investigate, repair, replace, or otherwise provide or performing corrective actions in response to the indication of the presence of the fault.

The sequence described is for understanding purposes only and is not meant to limit the method in any way as it is understood that the portions of the method can proceed in a different logical order, additional or intervening portions can be included, or described portions of the method can be divided into multiple portions, or described portions of the method can be omitted without detracting from the described method. For example, the method can include ceasing transmission of any electrical signal passing through the power transformer 16, 216 (e.g. by way of the controller module 36 or control signal 42 controlling the input filtering and switching circuit 22) in response to the satisfaction of the comparison. In another example, the comparing can further include comparing the sensed voltage to a set of threshold voltage values including at least a first predetermined energization voltage of the set of primary windings 26, 226 (for example, the voltage of the power source 14) and a second predetermined energization voltage of the set of secondary windings 28, 228 (for example, the voltage at the power output 18), and determining a fault of the electrical insulator layers occurs upon satisfaction of the comparison.

In yet another non-limiting example, the method can further include determining a fault in the insulation layer 288 separating the conductive shield layer 44, 244 from the set of primary windings 26, 226 upon satisfaction of a comparison of the sensed voltage to the first predetermined energization voltage of the set of primary windings 26, 226, and determining a fault in the insulation layer 288 separating the conductive shield layer 44, 244 from the set of secondary windings 28, 228 upon satisfaction of a comparison of the sensed voltage to the second predetermined energization voltage of the set of secondary windings 28, 228. In yet another non-limiting example, the set of threshold voltage values include a grounded voltage value (e.g. at an Earth ground 20 or relative ground value), and determining a grounding fault of the electrical insulator layers 288 occurs upon satisfaction of the comparison.

Many other possible aspects and configurations in addition to that shown in the above figures are contemplated by aspects of the disclosure. For example, while radially arranged windings 226, 228 are described and illustrated, additional configurations of power transformers for switched mode power supplies can be included. For instance, a set of primary windings can be axially spaced along the former 278 (or center leg 276 length) from a set of secondary windings, and wherein the electrical shielding layer(s) (including isolating non-conductive insulation layers) can ensure an axial barrier between the axially spaced windings detects or sensing faults. In the instance the axial barrier includes a non-conductive barrier, such as a portion of the former 278 itself (e.g. similar to a cap-like structure), additional electrical shielding layer(s) can be included, similar to the axial-facing shielding layers 444 described herein. Additionally, the design and placement of the various components can be rearranged such that a number of different in-line configurations could be realized.

The aspects disclosed herein provide a method and circuit for detecting an arc fault occurrence. The technical effect is that the above described aspects enable the operation of the circuit allowing or enabling the detecting of one or more arc faults in an electrical circuit, such as in a transformer. One advantage that can be realized in the above aspects of the disclosure is that the detection and extinguishing of arc faults (for example, by operating the input filtering and switching circuit 22) can limit damage of an energy escape during the arcing event.

Power converters in such architectures, such as transformers, need to mitigate against the failure of electrical isolation components. Aspects of the disclosure described herein use a shielding layer about, inside, and proximate to the main transformer (or windings thereof) to prevent breakdown of the primary windings to the secondary windings, or to a grounding or another conductive connection, and provides improved product and hence aircraft safety. Transformers in particular are susceptible to breakdown or partial discharge due to the minimal insulation thickness, which is typically minimized in order to maximize transformer power density.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical fault detecting circuit comprising:
a first conductor wound about a permeable magnetic core;
a second conductor wound about the permeable magnetic core;
a conductive shield layer positioned between the first conductor and the second conductor;
a set of electrical insulation layers separating the conductive shield layer from the first conductor and the conductive shield layer from the second conductor;
an energization source defining a predetermined non-zero voltage, the energization source conductively coupled with the conductive shield layer and energizing the conductive shield layer to the predetermined non-zero voltage; and
a controller module electrically coupled with the conductive shield layer;
wherein the controller module is configured to detect a change in electrical characteristics of the energized conductive shield layer.

2. The fault detecting circuit of claim 1 wherein the controller module comprises a sensor electrically coupled with the conductive shield layer and senses the electrical characteristic of the energized conductive shield layer.

3. The fault detecting circuit of claim 2 wherein the controller module is configured to provide at least one of a comparison of the sensed electrical characteristic, an indication of a comparison of the sensed electrical characteristic, or control at least one function in response to a comparison of the sensed electrical characteristic.

4. The fault detecting circuit of claim 3 wherein the controller module further comprises an electrical characteristic threshold value stored in memory, wherein the controller module compares the sensed characteristic to the characteristic threshold value.

5. The fault detecting circuit of claim 4 wherein the electrical characteristic threshold value further comprises a set of electrical characteristic threshold values, wherein the set of electrical characteristic threshold values includes a predetermined energized voltage of the first conductor and a predetermined energized voltage of the second conductor.

6. The fault detecting circuit of claim 5 wherein the controller module is configured to determine which of the first conductor or second conductor is faulted to the conductive shield layer based on the comparison of the sensed electrical characteristic with the set of electrical characteristic threshold values.

7. The fault detecting circuit of claim 1 wherein the energization source includes a voltage divider output supplying the predetermined non-zero voltage of the conductive shield layer.

8. The fault detecting circuit of claim 1 wherein the first conductor is a set of primary windings for a power transformer and the second conductor is a set of secondary windings for the power transformer.

9. The fault detecting circuit of claim 8 further comprising a former for winding the set of primary windings, the set of secondary windings, the conductive shield layer, and the set of electrical insulation layers.

10. A power transformer, comprising:
a former;
a set of primary windings circumferentially wound about the former and connected with a transformer power input;
a first insulation layer encircling the set of primary windings;
a conductive shield layer circumferentially wound about the first insulation layer and energized at a non-zero predetermined voltage by an energization source;
a second insulation layer encircling the conductive shield layer;
a set of secondary windings encircling the second insulation layer and connected with a transformer power output; and
a controller comprising a processor, the controller connected with the conductive shield layer and configured to perform operations comprising: sensing an actual voltage at the conductive shield layer and comparing the sensed actual voltage with a voltage threshold, and when the sensed actual voltage exceeds the voltage threshold, the controller is configured to perform operations comprising determining an electrical fault is present in the power transformer.

11. The power transformer of claim 10, further comprising a second conductive shield layer encircling the set of secondary windings and energized at the non-zero predetermined voltage, and wherein the controller is connected with the second conductive shield layer and configured to perform operations comprising sensing an actual voltage at the second conductive shield layer and comparing the sensed actual voltage at the second conductive shield layer with the voltage threshold, and when the sensed actual voltage at the second conductive shield layer exceeds the voltage threshold, the controller is configured to perform operations comprising determining the electrical fault is present in the power transformer.

12. The power transformer of claim 10, further comprising a second conductive shield layer encircling the set of secondary windings and energized at a second non-zero predetermined voltage, and wherein the controller is connected with the second conductive shield layer and configured to perform operations comprising sensing a second actual voltage at the second conductive shield layer and comparing the sensed second actual voltage at the second conductive shield layer with a second voltage threshold, and when the sensed second actual voltage at the second conductive shield layer satisfies the second voltage threshold, the controller is configured to perform operations comprising determining the electrical fault is present in the power transformer.

13. The power transformer of claim 12 wherein the voltage threshold and the second voltage threshold are different.

14. The power transformer of claim 10 wherein the former includes axially spaced end caps defining a surface facing the opposing end cap and having a second conductive shield layer positioned on each end cap surface, the second conductive shield layer energized at a second predetermined voltage, and wherein the controller is connected with the second conductive shield layer and configured to perform operations comprising sensing an second actual voltage at the second conductive shield layer and comparing the sensed second actual voltage at the second conductive shield layer with a second voltage threshold, and when the sensed second actual voltage at the second conductive shield layer satisfies the second voltage threshold, the controller is configured to perform operations comprising determining the electrical fault is present in the power transformer.

15. A method of detecting a fault in a power transformer having a conductive shield layer sandwiched between electrical insulating layers separating the conductive shield layer from a first conductor and a second conductor, the second conductor opposite the conductive shield layer from the first conductor, the method comprising:

sensing a voltage energizing the shield layer;

comparing the sensed voltage to a threshold voltage value corresponding to a fault; and upon satisfaction of the comparison, providing a fault indication when the comparison indicates the presence of the fault.

16. The method of claim 15 further comprising ceasing transmission of any electrical signal passing through the power transformer in response to the satisfaction of the comparison.

17. The method of claim 15 wherein the comparing further comprises comparing the sensed voltage to a set of threshold voltage values including at least a first predetermined energization voltage of the first conductor and a second predetermined energization voltage of the second conductor, and determining a fault of the electrical insulator layers occurs upon satisfaction of the comparison.

18. The method of claim 17, further comprising determining a fault in the electrical insulation layer separating the conductive shield layer from the first conductor upon satisfaction of a comparison of the sensed voltage to the first predetermined energization voltage of the first conductor, and determining a fault in the electrical insulation layer separating the conductive shield layer from the second conductor upon satisfaction of a comparison of the sensed voltage to the second predetermined energization voltage of the second conductor.

19. The method of claim 17 wherein the set of threshold voltage values include a grounded voltage value, and determining a grounding fault of the electrical insulator layers occurs upon satisfaction of the comparison.

20. The method of claim 15, further comprising performing a maintenance event upon satisfaction of the comparison.

* * * * *